United States Patent [19]
Parker et al.

[11] Patent Number: 6,124,755
[45] Date of Patent: *Sep. 26, 2000

[54] METHOD AND APPARATUS FOR BIASING A CHARGE PUMP

[75] Inventors: Douglas R. Parker, Forest Grove; Gregory F. Taylor, Portland, both of Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/941,779

[22] Filed: Sep. 29, 1997

[51] Int. Cl.$^7$ .................................................. G05F 1/10
[52] U.S. Cl. ......................................... 327/543; 327/112
[58] Field of Search .................................. 327/111, 112, 327/530, 538, 543, 148, 157, 53, 536; 331/17, DIG. 2

[56] References Cited

U.S. PATENT DOCUMENTS

| | | | |
|---|---|---|---|
| 4,714,900 | 12/1987 | Sata .............................................. | 331/8 |
| 4,814,726 | 3/1989 | Byrd et al. ................................. | 331/1 A |
| 5,068,626 | 11/1991 | Takagi et al. ............................... | 331/17 |
| 5,212,458 | 5/1993 | Fitzpatrick et al. ...................... | 330/288 |
| 5,239,455 | 8/1993 | Fobbester et al. ......................... | 363/60 |
| 5,363,066 | 11/1994 | Chen et al. ................................ | 327/157 |
| 5,412,349 | 5/1995 | Young et al. .............................. | 331/34 |
| 5,508,660 | 4/1996 | Gersbach et al. .......................... | 331/17 |
| 5,576,647 | 11/1996 | Sutardja et al. .......................... | 327/108 |
| 5,581,207 | 12/1996 | Bazes ....................................... | 327/261 |
| 5,592,370 | 1/1997 | Rogers ....................................... | 363/60 |
| 5,650,745 | 7/1997 | Merrill et al. ............................ | 327/404 |
| 5,694,072 | 12/1997 | Hsiao et al. .............................. | 327/537 |
| 5,760,640 | 6/1998 | Girard et al. ............................. | 327/530 |

FOREIGN PATENT DOCUMENTS 0778510  11/1997  European Pat. Off. .

OTHER PUBLICATIONS

Sedra et al., Microelectonic Circuits, Saunders College Publishing, p. 66, 1991.

*Primary Examiner*—Jung Ho Kim
*Attorney, Agent, or Firm*—Blakely, Sokoloff, Taylor & Zafman

[57] ABSTRACT

A method and an apparatus for biasing a charge pump in a phase locked loop in a circuit and generally for biasing a circuit through the use of a replica circuit. The method and apparatus make use of a replica circuit including substantially similar circuit elements to those circuit elements making up the circuit to be biased. Through the use of comparison and bias techniques, the replica circuit and the circuit to be biased are both biased. The bias conditions result from a comparison of the operation of the replica circuit and the circuit to be biased. Since the replica circuit operates in a manner substantially similar to an expected operation mode of the circuit to be biased, the bias conditions resulting from the comparisons will cause the circuit to be biased to operate similarly to how the replica circuit operates, while still handling external influences such as loading. Currents of two current sources within the circuit to be biased are equalized by biasing of one of the current sources responsive to the operation of both the circuit to be biased and a replica circuit. This equalization reduces the amount of error current erroneously added to or subtracted from a loop filter as a result of unequal currents flowing through the two current sources.

6 Claims, 8 Drawing Sheets

METHOD AND APPARATUS FOR BIASING A CHARGE PUMP

BACKGROUND OF THE INVENTION

1. Field of the Invention

The present invention relates generally to the field of electronics and particularly to charge pumps for phase locked loops in microprocessors.

2. Description of the Related Art

Phase locked loops are a well known form of circuit useful in synchronizing a clock signal internal to a circuit with an external clock signal. The block diagram of FIG. 1 represents a generally well understood design for such a phase locked loop.

FIG. 1 shows a high level design for a phase locked loop. Phase Detector 102 receives a Ref Clock 101 and a Feedback Clock signal 112, which is fed back through the loop. Phase Detector 102 compares Ref Clock 101 with Feedback Clock 112 and generates an Up signal 103 and a Down signal 104. Charge Pump 105 receives Up signal 103 and Down signal 104 and generates an Ipump signal 106. Loop Filter 107 receives Ipump signal 106 and converts Ipump signal 106 to Vcontrol signal 108. VCO 109 receives Vcontrol signal 108 and generates Internal Clock signal 110. Divide-by-N 111 receives Internal Clock signal 110 and divides Internal Clock signal 110 by a designed in factor N to generate Feedback Clock 112. Feedback Clock 112 is fed back into the Phase Detector 102 as described above, such that the Internal Clock signal 110 eventually is a multiple of Ref Clock 101.

One disadvantage of the prior art scheme illustrated in FIG. 1 involves the current sources used to add or subtract current in Charge Pump 105. If these sources do not deliver the same current over all operating conditions then the up and down signals 103 and 104 produced by phase detector 102, even if perfectly matched, will produce some sort of error current which will be erroneously added to or subtracted from the capacitor in loop filter 107.

One prior art solution involves circuit designers attempting to size all devices involved such that the currents match as closely as possible according to the models of the semiconductor process available. Sizing all devices for matched performance suffers from two problems, both well known in the prior art. First, models predict how a circuit will behave, but these models are often incorrect in their predictions. Second, processes vary over time in any manufacturing environment, and these variations produce irregularities in the size of devices. Circuit designers and layout engineers can place critical components together to reduce the differences in these variations, but these efforts to avoid process variations are limited in their effectiveness.

Another prior art method of dealing with the charge pump problem involves optimizing the circuit for operation around the expected operating point. This method also has drawbacks. First, optimization depends on the same models that the sizing method depends on, so optimization will often not lead to the best result in practice. However, no amount of modeling can predict what apparently suboptimal design will produce the optimal product until after production occurs. Second, operating points of circuits vary with factors often beyond the control of the designer, such as temperature, power supply variations, and in the case of phase locked loops external clock frequency. Any commercially viable product will have to operate over enormous ranges of temperature and power supply at a minimum, and optimization can only occur for one operating point.

FIG. 2 shows a general diagram of a prior art charge pump for a phase locked loop. Up Current Source 201 supplies a current. Coupled in series with Up Current Source 201 is Up Switch 202, which is controlled by Up signal 203 and Upbar Switch 205, which is controlled by Upbar signal 204. Coupled to Up Switch 202 is Down Switch 209, which is controlled by Down signal 208. Coupled in series with Upbar Switch 205 is Downbar Switch 211, which is controlled by Downbar signal 210. Coupled in series with Down Switch 209 and Downbar Switch 211 is Down Current Source 212, which supplies (or sinks) a current. Voltage node Vcontrol 206 is disposed between Up Switch 202 and Down Switch 209. An OpAmp 207 has its positive input coupled to Vcontrol 206. OpAmp 207 has its output and its negative input coupled to a voltage node between Downbar Switch 211 and Upbar Switch 205.

Voltage node Vcontrol 206 is coupled to Loop Filter 107 of FIG. 1. The current supplied through Up Switch 202 and Down Switch 209 is the current signal Ipump 106 of FIG. 1. By charging or discharging a capacitor (not shown) in Loop Filter 107, current signal Ipump 106 is converted to voltage Vcontrol 108 of FIG. 1.

One problem with the charge pump illustrated in FIG. 2 is that the problem of current sources 201 and 212 not delivering the same amount of current over all operating conditions is not addressed. Thus, what is desired is a charge pump such that the currents delivered by the current sources are substantially equal over a variety of operating conditions.

SUMMARY OF THE INVENTION

A method and an apparatus for generating an output control signal of a charge pump circuit is disclosed. In one embodiment, an output control signal of a charge pump circuit is generated by comparing an output node of the charge pump circuit with an output node of a reference charge pump circuit and biasing the charge pump circuit based on the results of comparing the output nodes of the charge pump circuit and the reference charge pump circuit. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for biasing a charge pump in a phase locked loop is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Figure 1:
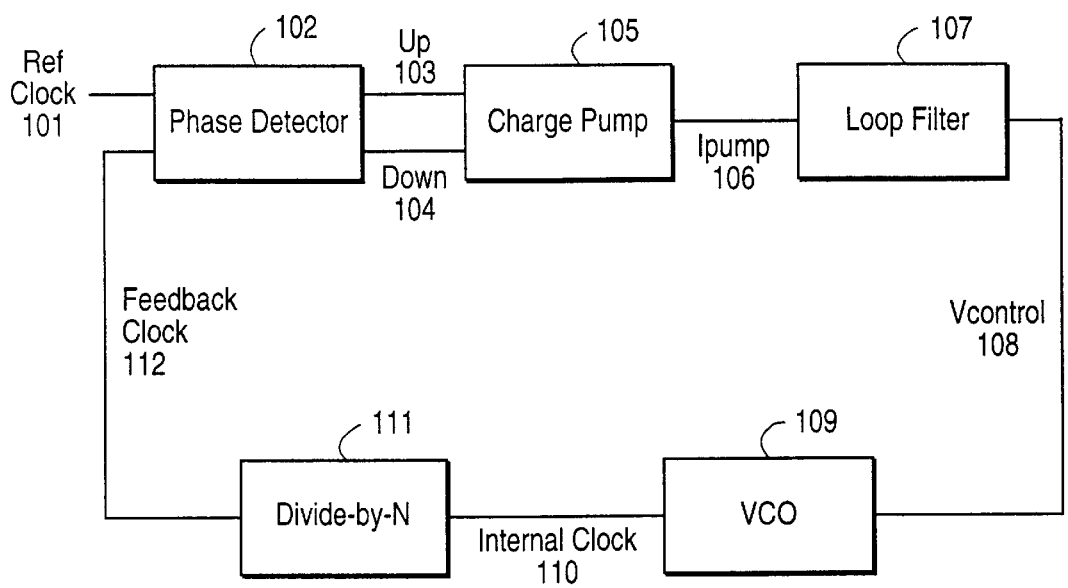
FIG. 1 is a block diagram of a phase locked loop.
Figure 2:
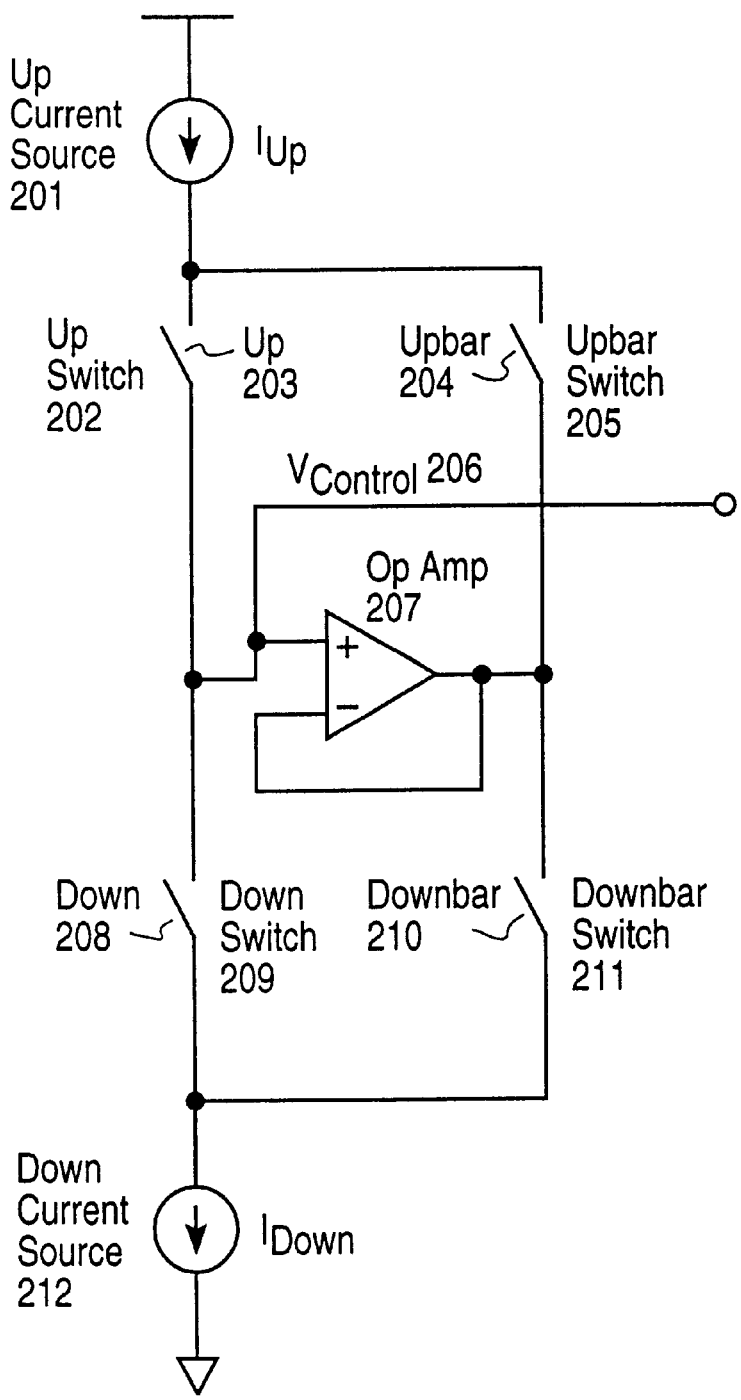
FIG. 2 is a diagram of a prior art charge pump.
Figure 3:
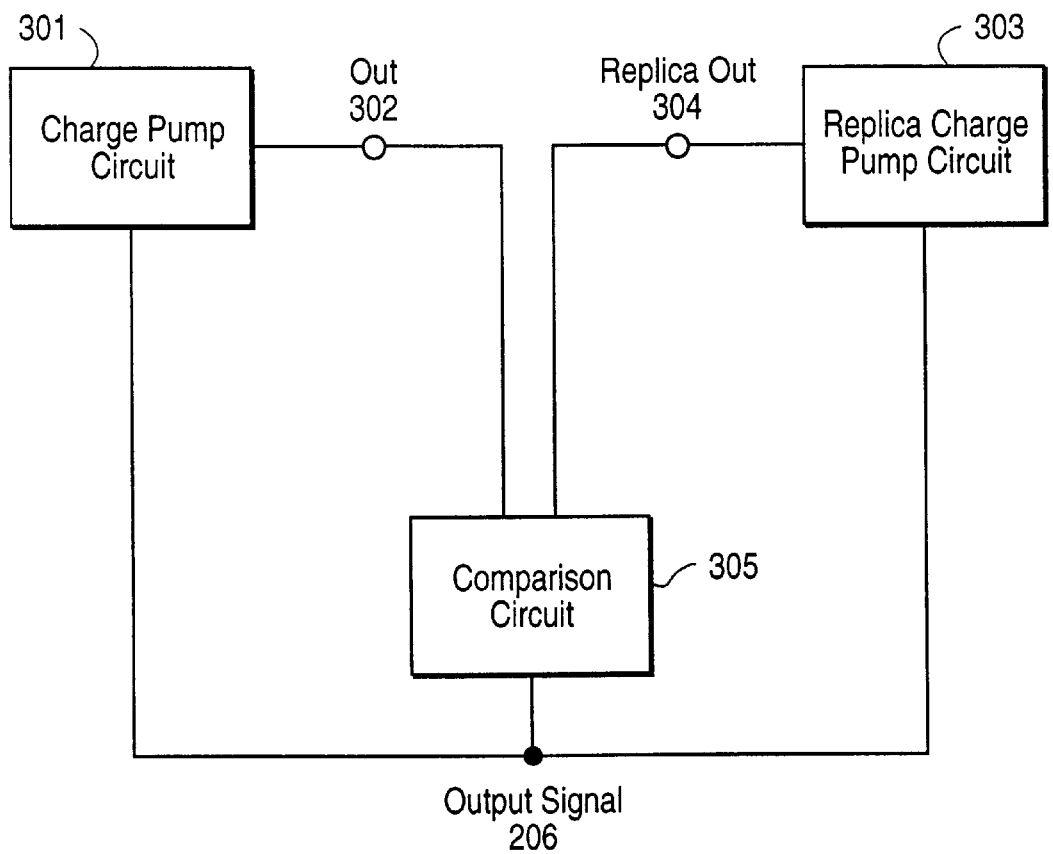
FIG. 3 is a block diagram of one embodiment of a charge pump in accordance with the teachings of the present invention.

FIG. 3 is a block diagram of one embodiment of the present invention. Charge Pump Circuit 301 produces Out signal 302. Replica Charge Pump Circuit 303 produces a Replica Out signal 304. Comparison Circuit 305 compares Out signal 302 and Replica Out signal 304 and produces Output Signal 206. Output Signal 206 is coupled to Charge Pump 301 and Replica Charge Pump 303, and this coupling causes Charge Pump 301 and Replica Charge Pump 303 to change their operation in response to the comparison of Out signal 302 and Replica Out signal 304. Replica Charge Pump Circuit 303 is a second circuit intended by its designers to include components substantially similar to the components of Charge Pump Circuit 301 and intended by its designers to operate in a manner substantially similar to an expected mode of operation of Charge Pump Circuit 301.

Figure 4:
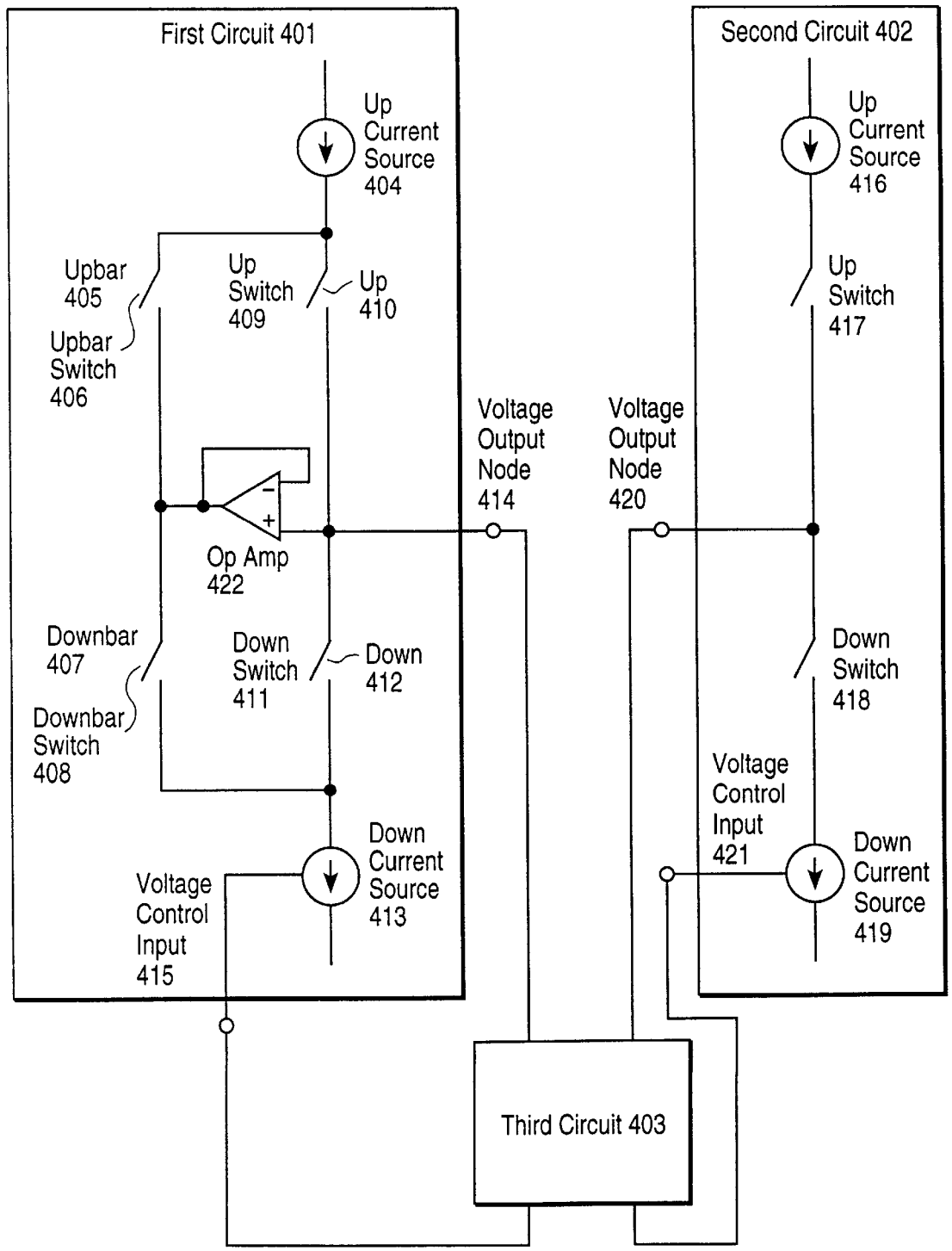
FIG. 4 is a diagram of another embodiment of a charge pump in accordance with the teachings of the present invention.

FIG. 4 is a diagram of another embodiment of the present invention showing a greater level of detail than FIG. 3. First Circuit 401 corresponds to Charge Pump Circuit 301 of FIG. 3, as Second Circuit 402 corresponds to Replica Charge Pump Circuit 303 of FIG. 3. Likewise, Voltage Output Node 414 corresponds to Out signal 302, and Voltage Output Node 420 corresponds to Replica Out signal 304.

Up Current Source 404 supplies a current. Coupled in series with Up Current Source 404 is Up Switch 409 controlled by Up signal 410 and Upbar Switch 406 controlled by Upbar signal 405. Coupled to Up Switch 409 is Down Switch 411 controlled by Down signal 412. Coupled in series with Upbar Switch 406 is Downbar Switch 408 controlled by Downbar signal 407. Coupled in series with Down Switch 411 and Downbar Switch 408 is a voltage controlled current source Down Current Source 413 which supplies (or sinks) a current. Voltage Output Node 414 is disposed between Up Switch 409 and Down Switch 411. OpAmp 422 has its positive input coupled to Voltage Output Node 414. OpAmp 422 has its output and its negative input coupled to a voltage node between Downbar Switch 408 and Upbar Switch 406.

In operation, Up Switch 409 allows current to flow through to Voltage Output Node 414 when signaled by Up signal 410. Down Switch 411 allows current to flow away from Voltage Output Node 414 when signaled by Down signal 412. To reduce transient currents in the current sources, Upbar Switch 406 and Downbar Switch 408 are supplied, providing an alternate path for current from the current sources when that current is not needed to alter the voltage of Voltage Output Node 414. OpAmp 422 suppresses charge sharing.

Second Circuit 402 includes an Up Current Source 416, an Up Switch 417, a Down Switch 418, and a voltage-controlled current source Down Current Source 419 controlled by Voltage Control Input 421. Voltage node 420 is disposed between Up Switch 417 and Down Switch 418. Up Current Source 416 is substantially similar to Up Current Source 404. Down Current Source 419 is substantially similar to Down Current Source 413. Up Switch 417 is substantially similar to Up Switch 409. Down Switch 418 is substantially similar to Down Switch 411. For the purposes of the present invention, substantial similarity means to make the substantially similar components as identical as necessary in view of the design requirements of the circuit. This can mean anything from providing scale models of the components in roughly similar proportions all the way to matching size and layout characteristics on the silicon from one device to its substantially similar device.

The combination of Up Current Source 404, Up Switch 409, Down Switch 411 and Down Current Source 413 can be thought of as a primary current path. When Up Switch 409 is conducting current and Down Switch 411 is also conducting current then a path straight from power to ground is formed.

In the case of the embodiment illustrated in FIG. 4, Up Switch 417 is coupled in such a way that it always conducts current when powered rather than being controlled by a signal as Up Switch 409 is controlled by Up signal 410. Up Switch 417 can be thought of as controlled by a reference potential such as the ground or power potential of a circuit. Likewise, Down Switch 418 is coupled in such a way that it always conducts current when powered in contrast to the control of Down Switch 411 by Down signal 412. This produces a current path in Second Circuit 402 that models the path produced in First Circuit 401 when both Up Switch 409 and Down Switch 411 are conducting current.

Third Circuit 403 performs the comparison task by comparing Voltage Output Node 414 with Voltage Output Node 420. Since Third Circuit 403 is coupled to both Voltage Control Input 415 and Voltage Control Input 421, it can bias the Down Current Source 413 and Down Current Source 419. This action, in the embodiment illustrated in FIG. 4, tends to equalize the current flowing between Down Current Source 413 and Down Current Source 419. If the currents flowing through Up Current Source 404 and Up Current Source 416 are equal, then this circuit effectively equalizes the currents flowing through all substantially similar components. Since Second Circuit 402 has no load, the currents flowing through First Circuit 401 have magnitudes they would have if First Circuit 401 had no load, and that results in the current flowing through Up Switch 409 and through Down Switch 411 being substantially equal in magnitude when the switches conduct.

Figure 5:
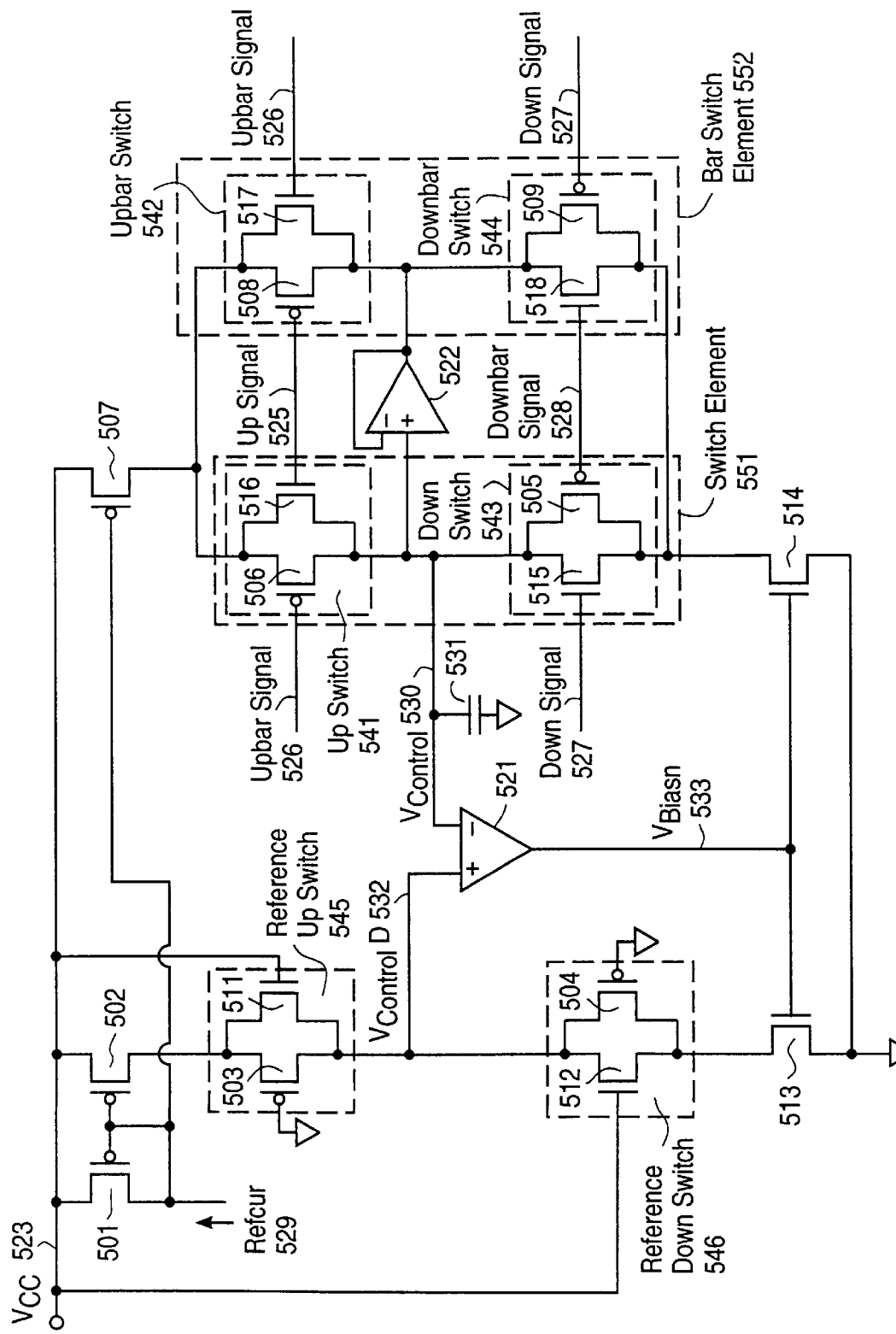
FIG. 5 is a schematic of yet another embodiment of a charge pump in accordance with the teachings of the present invention.

FIG. 5 is a detailed schematic of another embodiment of a charge pump in accordance with the teachings of the present invention. Refcur 529 signal is a current flowing through PMOS device 501. PMOS devices 502 and 507 have their gates coupled to the gate of PMOS device 501 thereby causing a current proportional to Refcur 529 to flow through their channels according to well-known current-mirroring techniques. In one embodiment, PMOS devices 501, 502, and 507 are all sized identically and formed identically on a silicon chip, but other embodiments of the present invention may use larger sized devices to produce proportionally larger currents in accordance with the teachings of the present invention.

Up Switch 541 is coupled in series with PMOS device 507, and includes PMOS device 506 and NMOS device 516. PMOS device 506 has its gate coupled to Upbar signal 526 and NMOS device 516 has its gate coupled to Up signal 525. One leg of PMOS device 506 is coupled to a corresponding leg of NMOS device 516, while the other leg of PMOS device 506 is coupled to the other leg of NMOS device 516, thereby creating a switching structure. In this embodiment, signals Up 525 and Upbar 526 are complementary.

The structure of Down Switch 543 corresponds to the structure of Up Switch 541 in that PMOS device 505 is coupled to NMOS device 515 in the same manner that PMOS device 506 is coupled to NMOS device 516. However, the gate of NMOS device 515 is tied to Down signal 527 and the gate of PMOS device 505 is tied to Downbar signal 528. Down Switch 543 is coupled in series with Up Switch 541.

Coupled in series with Down Switch 543 is NMOS device 514. NMOS device 514 acts as a current source or current sink in much the same manner as PMOS device 507.

The series coupling of Up Switch 541 and Down Switch 543 creates what can be thought of as a switch element. Likewise, the coupling in series of Upbar Switch 542 and Downbar Switch 544 creates what can be thought of as a Bar switch element. Upbar Switch 542, which includes PMOS device 508 and NMOS device 517 has the same structure as Up Switch 541. However, PMOS device 508 has its gate coupled to Up signal 525 and NMOS device 517 has its gate coupled to Upbar signal 526. As such, Upbar Switch 542 is controlled by a signal complementary to that controlling Up Switch 541, so at any given time, one switch of the two will conduct while the other does not conduct.

Downbar Switch 544, which includes PMOS device 509 and NMOS device 518 has the same structure as Down Switch 543, except that PMOS device 509 has its gate coupled to Down signal 527 and NMOS device 518 has its gate coupled to Downbar signal 528. Thus, Downbar Switch 544 and Down Switch 543 have the same complementary relationship that Up Switch 541 and Upbar Switch 542 have.

Additionally, Bar Switch Element 552 is coupled in parallel with Switch Element 551, such that Upbar Switch 542 is coupled in series with PMOS device 507 and Downbar Switch 544 is coupled in series with NMOS device 514. Operational Amplifier (OpAmp) 522 has its output and negative input coupled to a node between Upbar Switch 542 and Downbar Switch 544, and its positive input coupled to Vcontrol 530, the voltage node between Up Switch 541 and Down Switch 543. With the addition of OpAmp 522, charge sharing is suppressed, and current steering between the two switch elements is possible, thereby reducing transient conditions that may occur when current starts or stops flowing.

Reference Up Switch 545 is coupled in series with PMOS device 502 and includes PMOS device 503 and NMOS device 511. Reference Up Switch 545 is substantially similar to Up Switch 541. However, PMOS device 503 has its gate coupled to Ground 524 and NMOS device 511 has its gate coupled to Vcc 523. As a result, Reference Up Switch is always conducting current during normal operation of the circuit. Likewise, Reference Down Switch 546, including PMOS device 504 and NMOS device 512, is substantially similar to Down Switch 543. However, the gate of PMOS device 504 is coupled to Ground 524 and the gate of NMOS device 512 is coupled to Vcc 523. Thus, Reference Down Switch 546 is configured to always conduct, too.

Reference Down Switch 546 is coupled in series with NMOS device 513, and the combination of PMOS device 502, Reference Up Switch 545, Reference Down Switch 546, and NMOS device 513 is substantially similar to the combination of PMOS device 507, Up Switch 541, Down Switch 543, and NMOS device 514. Further, voltage node Vcontrol 530 corresponds to voltage node Vcontrold 532 which is the node between Reference Up Switch 545 and Reference Down Switch 546.

Operational Amplifier (OpAmp) 521 has its negative input coupled to Vcontrol 530 and its positive input coupled to Vcontrold 532. OpAmp 521 has its output coupled to Vbias 533, which is the node controlling the gates of NMOS devices 513 and 514. As a result, OpAmp 521 compares the values of Vcontrol 530 and Vcontrold 532, and adjusts Vbias 533 accordingly. These adjustments directly affect the amount of current flowing through NMOS devices 513 and 514, and this tends to equalize the values of Vcontrol 530 and Vcontrold 532. Since NMOS devices 513 and 514 are coupled at their gates and are both coupled to Ground 524 on one end, they should have the same current flowing through them. This also depends on whether NMOS devices 513 and 514 have the same voltage at the other end. However, because Down Switch 543 and Reference Down Switch 546 are substantially similar, and because Vcontrol 530 and Vcontrold 532 tend to equalize, this should be the case. So, the circuit should tend to equalize the currents between NMOS devices 513 and 514.

Since PMOS devices 507 and 502 have their gates coupled together, and one end of each is coupled to Vcc 523, they will tend to have the same current flowing through them. Furthermore, this is reinforced because Reference Up Switch 545 is substantially similar to Up Switch 541 and because Vcontrol 530 and Vcontrold 532 tend to equalize.

In one embodiment, all NMOS devices (511–518) are all sized and oriented as close to identically as possible. Likewise, all PMOS devices (501–509) are all sized and oriented as close to identically as possible. In another embodiment, all of the NMOS and PMOS devices included in all switches are one size and matched, and all of the NMOS and PMOS devices included in the current sources are another size and matched. Additionally, the couplings between PMOS device 502, Reference Up Switch 545, Reference Down Switch 546, and NMOS device 513 correspond to the couplings between PMOS device 507, Up Switch 541, Down Switch 543, and NMOS device 514 respectively. Thus, the combination of PMOS device 502, Reference Up Switch 545, Reference Down Switch 546 and NMOS device 513 replicates the combination of PMOS device 507, Up Switch 541, Down Switch 543, and NMOS device 514, much as the Second Circuit 402 of FIG. 4 replicates portions of the First Circuit 401 of FIG. 4.

One skilled in the art will naturally see that many variations on the circuits involved in these figures could arise while still following the teachings of the present invention. For instance, FIG. 6 displays another embodiment of the present invention, where the Up Current Source 604 and the Up Current Source 616 are controlled by the Comparison Circuit 603. This is a mirror image of the circuits in FIG. 4, and it demonstrates the flexibility inherent in this approach.

First Circuit 601 includes Down Current Source 613 which sinks a current. Coupled in series with Down Current Source 613 is Down Switch 612 controlled by Down signal 611 and Downbar Switch 608 controlled by Downbar signal 607. Coupled to Down Switch 612 is Up Switch 609 controlled by Up signal 610. Coupled in series with Downbar Switch 608 is Upbar Switch 606 controlled by Upbar signal 605. Coupled in series with Up Switch 609 and Upbar Switch 606 is Up Current Source 604 which supplies a current. Voltage Output Node 614 is disposed between Up Switch 609 and Down Switch 612. OpAmp 622 has its positive input coupled to Voltage Output Node 614. OpAmp 622 has its output and its negative input coupled to a voltage node between Downbar Switch 608 and Upbar Switch 606.

In operation, Up Switch 609 allows current to flow through to Voltage Output Node 614 when signaled by Up signal 610. Down Switch 612 allows current to flow away from Voltage Output Node 614 when signaled by Down signal 611. To reduce transient currents in the current sources, Upbar Switch 606 and Downbar Switch 608 are supplied, providing an alternate path for current from the current sources when that current is not needed to alter the voltage of Voltage Output Node 614. OpAmp 622 suppresses charge sharing.

Second Circuit 602 includes a voltage-controlled current source Up Current Source 616 controlled by Voltage Control Input 621, an Up Switch 617, a Down Switch 618, and Down Current Source 619. Voltage node 620 is disposed between Up Switch 617 and Down Switch 618. Up Current Source 616 is substantially similar to Up Current Source 604. Down Current Source 619 is substantially similar to Down Current Source 613. Up Switch 617 is substantially similar to Up Switch 609. Down Switch 618 is substantially similar to Down Switch 612. For the purposes of the present invention, substantial similarity means to make the substantially similar components as identical as necessary in view of the design requirements of the circuit. This can mean anything from providing scale models of the components in roughly similar proportions all the way to matching size and layout characteristics on the silicon from one device to its substantially similar device.

The combination of Up Current Source 604, Up Switch 609, Down Switch 612 and Down Current Source 613 can be thought of as a primary current path. When Up Switch 609 is conducting current and Down Switch 612 is also conducting current then a path straight from power to ground is formed.

In the case of the embodiment illustrated in FIG. 4, Up Switch 617 is coupled in such a way that it always conducts current when powered rather than being controlled by a signal as Up Switch 609 is controlled by Up signal 610. Up Switch 617 can be thought of as controlled by a reference potential such as the ground or power potential of a circuit. Likewise, Down Switch 618 is coupled in such a way that it always conducts current when powered in contrast to the control of Down Switch 612 by Down signal 611. This produces a current path in Second Circuit 602 that models the path produced in First Circuit 601 when both Up Switch 609 and Down Switch 612 are conducting current.

Third Circuit 603 performs the comparison task by comparing Voltage Output Node 614 with Voltage Output Node 620. Since Third Circuit 603 is coupled to both Voltage Control Input 615 and Voltage Control Input 621, it can bias the Up Current Source 604 and Up Current Source 616. This action, in the embodiment illustrated in FIG. 6, tends to equalize the current flowing between Up Current Source 604 and Up Current Source 616. If the currents flowing through Down Current Source 613 and Down Current Source 619 are substantially equal, then this circuit effectively equalizes the currents flowing through all substantially similar components. Since Second Circuit 602 has no load, the currents flowing through First Circuit 601 have magnitudes they would have if First Circuit 601 had no load, and that ensures that the current flowing through Up Switch 609 and through Down Switch 612 will be equal in magnitude when the switches conduct.

Figure 7:
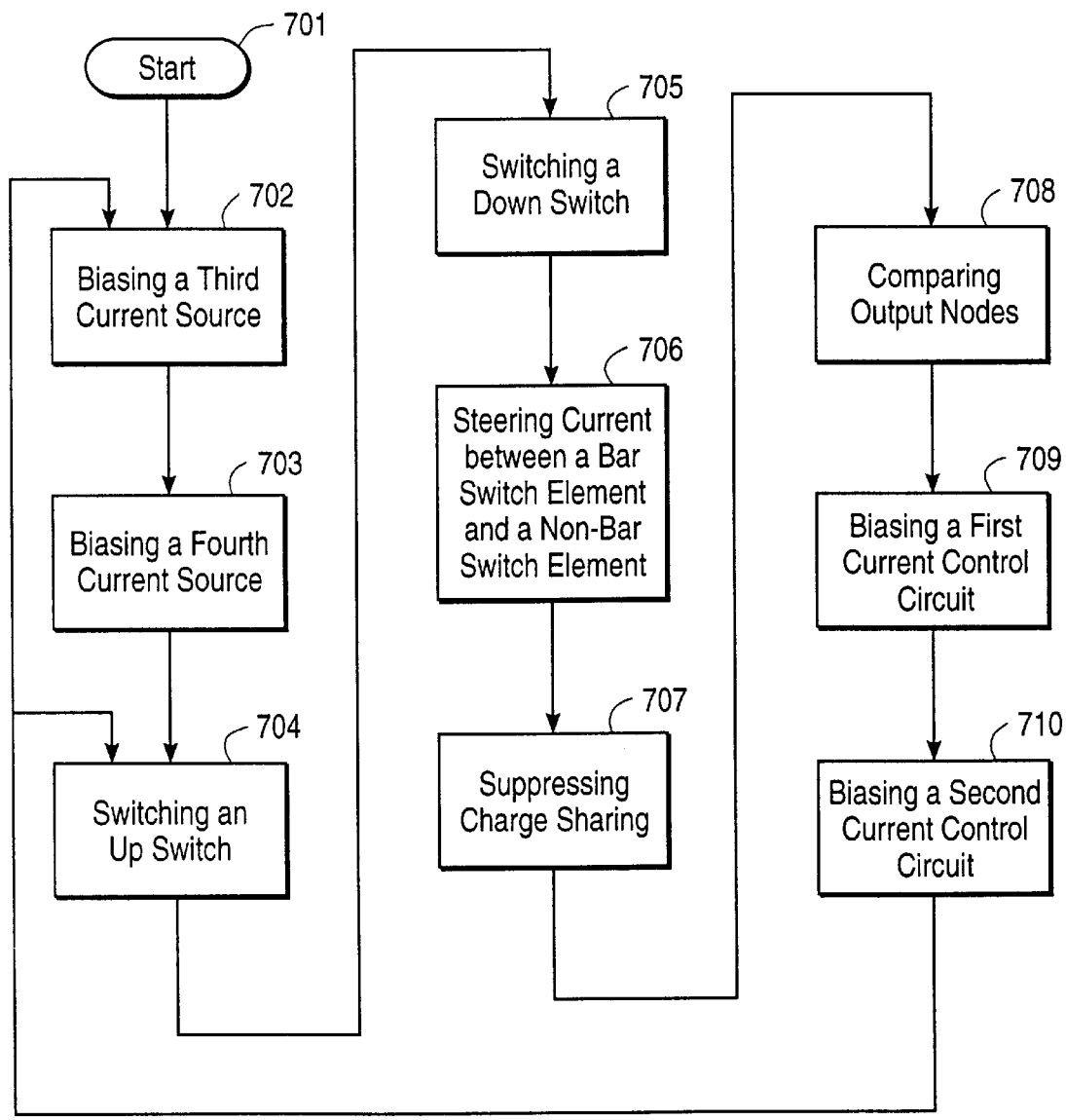
FIG. 7 is a flow diagram illustrating steps performed in accordance with the teachings of the present invention.

FIG. 7 illustrates the method of the present invention. It can best be described in conjunction with FIG. 4. The first step of FIG. 7 is Start 701, and that represents applying power to the entirety of the circuits of FIG. 4. The next step of FIG. 7 is Biasing a Third Current Source 702 (Biasing 702) which represents biasing Up Current Source 404 of FIG. 4 to conduct current of a desired magnitude. The next step of FIG. 7 is Biasing a Fourth Current Source 703 (Biasing 703) which represents biasing Up Current Source 416 of FIG. 4 to conduct current of a desired magnitude. In one embodiment of the invention the steps of Biasing a Third Current Source 702 and Biasing a Fourth Current Source 703 cause the two current sources to conduct currents with magnitudes proportional to each other as chosen by the designer of the circuits.

Next in the sequence of FIG. 7 comes Switching an Up Switch 704 (Switching 704) which corresponds to switching Up Switch 409 of FIG. 4. In the embodiment of FIG. 4, Up Switch 409 switches in response to Up signal 410. Next in the sequence of FIG. 7 comes Switching a Down Switch 705 (Switching 705) which corresponds to switching Down Switch 411 of FIG. 4. Likewise, in the embodiment of FIG. 4, Down Switch 411 switches in response to Down signal 412.

Next in the sequence of FIG. 7 comes Steering Current between a Bar Switch Element and a Non-Bar Switch Element 706 (Steering Current 706). In FIG. 4, the series coupling of Up Switch 409 and Down Switch 411 can be thought of as a Non-Bar Switch Element, and the series coupling of Upbar Switch 406 and Downbar Switch 408 can be thought of as a Bar Switch Element. The step of Steering Current 706 represents steering the current conducted by Up Current Source 404 between the Non-Bar Switch Element and the Bar Switch Element depending on which of the switches are conducting.

Next in the sequence of FIG. 7 comes Suppressing Charge Sharing 707 (Suppressing 707) which represents the function performed by OpAmp 422 of FIG. 4. OpAmp 422 suppresses charge sharing between the two Switch Elements and thereby reduces error current resulting from charge built up in either Switch Element.

Next in the sequence of FIG. 7 comes Comparing Output Nodes 708 which represents the function performed by Third Circuit 403. Third Circuit 403 compares the voltage of Voltage Output Node 414 to the voltage of Voltage Output Node 420.

Next in the sequence of FIG. 7 comes Biasing a First Current Control Circuit 709 (Biasing 709) which represents the biasing of Down Current Source 413 of FIG. 4 by Third Circuit 403. Third Circuit 403 varies the voltage at Voltage Control Input 415 which biases Down Current Source 413. Responsive to these variations in voltage, Down Current Source 413 varies the magnitude of the current it conducts.

Next in the sequence of FIG. 7 comes Biasing a Second Current Control Circuit 710 (Biasing 710) which represents the biasing of Down Current Source 419 of FIG. 4 by Third Circuit 403. Third Circuit 403 varies the voltage at Voltage Control Input 421 which biases Down Current Source 419. Responsive to these variations in voltage, Down Current Source 419 varies the magnitude of the current it conducts.

In one embodiment of the invention, the steps of Biasing 709 and Biasing 710 produce a current in the second current control circuit having a magnitude proportional to the current in the first current control circuit.

Figure 6:
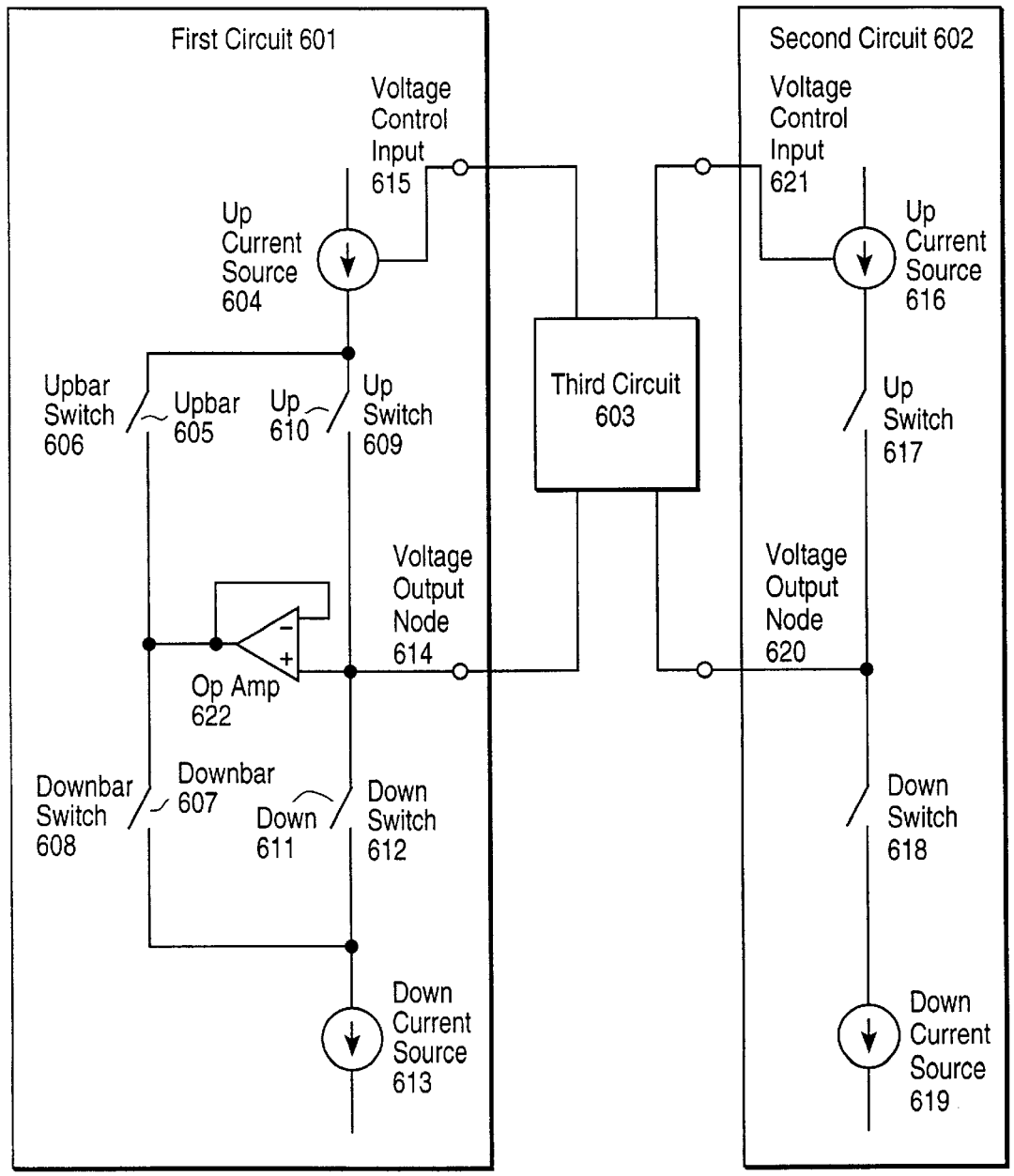
FIG. 6 is a diagram of still another embodiment of a charge pump in accordance with the teachings of the present invention.

As will be readily apparent to one having ordinary skill in the art, the method illustrated in FIG. 7 can apply to the circuits of FIG. 5 and FIG. 6, and can be adapted without undue experimentation to apply to the circuits of FIG. 3, too. Likewise, the method of FIG. 7 could be applied to many circuits not illustrated in the application. Details of the method of FIG. 7 as applied to the other circuits are not included in order to avoid obscuring the invention.

As will also be readily apparent to one skilled in the art, FIG. 7 represents the method exercised by a circuit during its operation. As circuits often operate in a parallel and continuous manner, it will be appreciated that all of the steps of FIG. 7 can occur simultaneously and continuously throughout operation of the circuit, even though illustration of such operation does not lend itself to the flow diagram illustration. Likewise, it will be appreciated that these steps can occur upon startup of the circuit only, or they can occur at startup and continue throught operation of the circuit. As such, the arrow leading out of the step of Biasing 710 points to both the step of Switching 704 and the step of Biasing 702 as a way to illustrate this concept of continuous and simultaneous operation.

Additionally, one skilled in the art will appreciate that to the extent the steps of the method of FIG. 7 do occur in a sequential rather than a simultaneous manner that they need not follow the sequence of FIG. 7, but could follow any sequence, that they need not include all steps and that they might include additional steps.

Figure 8A:
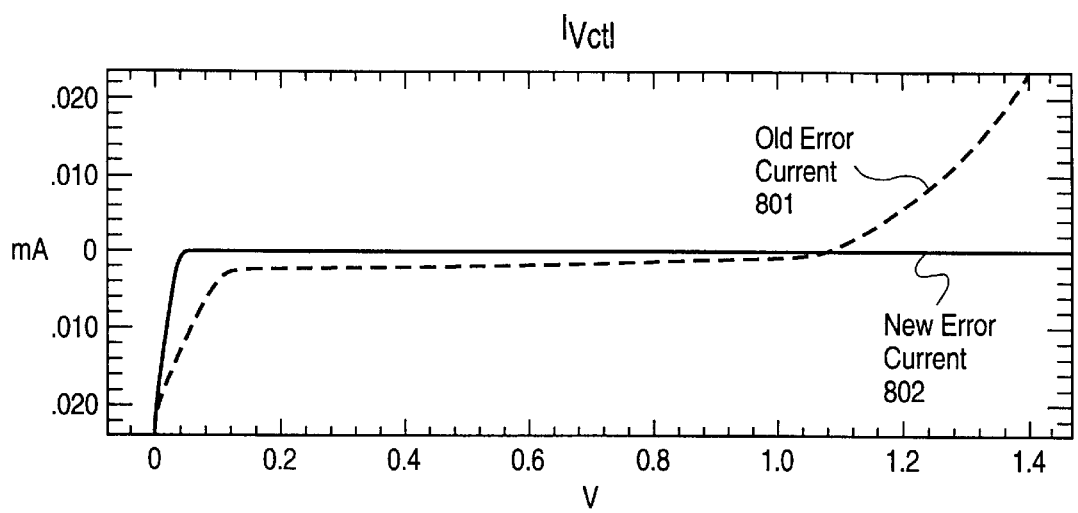
FIG. 8a is a plot of error current in both a prior art charge pump and an embodiment of a charge pump in accordance with the teachings of the invention.

FIG. 8a illustrates some of the advantages of the present invention over the prior art. Old error current 801 is the error current produced by the a prior art charge pump. New error current 802 is the error current produced by one embodiment of the present invention. These error currents represent the charge erroneously added to or subtracted from the loop filter capacitor by a charge pump. As can be seen, New error current 802 has the desired value of zero for a much wider range of operating points than does Old error current 801.

Figure 8B:
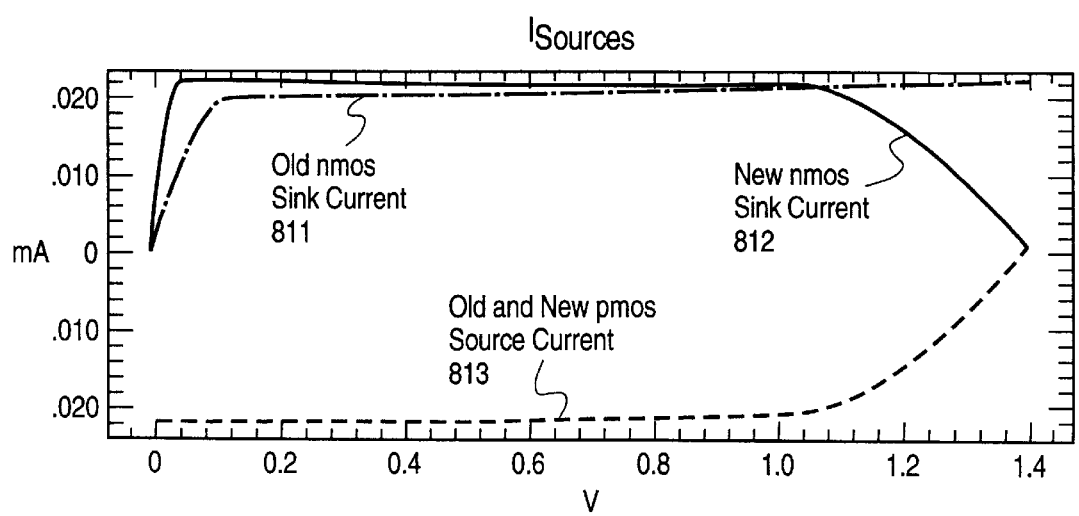
FIG. 8b is a plot of the source and sink currents of both a prior art charge pump and an embodiment of a charge pump in accordance with the teachings of the invention.

FIG. 8b illustrates another of the advantages of the present invention over the prior art. Old nmos sink current 811 is the sink current of a down current source as produced by a prior art charge pump. New nmos sink current 812 is the sink current of a down current source as produced by one embodiment of the present invention. Old and new pmos source current 813 is the source current produced both by the prior art and by one embodiment of the present invention. As can readily be seen, new nmos sink current 812 mirrors old and new pmos source current 813 for a wider range of operating points than does old nmos sink current 811.

In the foregoing detailed description, the method and apparatus of the present invention have been described with reference to specific exemplary embodiments thereof. It will, however, be evident that various modifications and changes may be made thereto without departing from the broader spirit and scope of the present invention. As an example, while MOS devices are used throughout the present invention, adapting this invention to use other technologies such as biploar junction transistors would be a modification within the spirit and scope of the present invention. The present specification and figures are accordingly to be regarded as illustrative rather than restrictive.

What is claimed is:

1. A method of generating an output control signal of a charge pump circuit, the charge pump circuit having a voltage control output, a bias input, an up signal input and a down signal input, the charge pump circuit configured to alter charge at a voltage control node of a voltage controlled oscillator in a phase locked loop, the method comprising:

receiving an up signal at the up signal input and a down signal at the down signal input from a phase detector;

sourcing charge to the voltage control node through the voltage control output and an up switch selectively, based on the up signal input;

sinking charge from the voltage control node through the voltage control output and a down switch selectively, based on the down signal input;

sourcing and sinking charge through the up and down switches at the same time;

comparing the voltage control output of the charge pump circuit with an output node of a reference charge pump circuit; and biasing a first current control circuit coupled through the down switch to the output node of the charge pump circuit in response to the comparing, the biasing equalizing a rate of charge sinking with a rate of the charge sourcing.

2. The method described in claim 1 further comprising:

steering current between the down switch and a downbar switch coupled to the first current control circuit in response to a downbar signal;

steering current between the up switch and an upbar switch of the charge pump in response to an upbar signal, the upbar switch coupled to the downbar switch at a first node; and suppressing charge sharing between the first node and the voltage control output.

3. An apparatus, comprising:

a charge pump circuit having a first circuit and a second circuit and a comparison circuit, the first circuit having a voltage control output, the first circuit having an up signal input and a down signal input, the first circuit having an up switch configured to receive the up signal input, the first circuit having a down switch configured to receive the down signal input, the up switch coupled to source current to the voltage control output, the down switch coupled to sink current from the voltage control output, the down switch coupled to a current control circuit of the first circuit, the current control circuit having a bias input, the voltage control output configured to conduct charge to a voltage control node of a voltage controlled oscillator of a phase locked loop, the up switch configured to source charge directly through the down switch when the up signal input and the down signal input both signal current conduction, the second circuit having a replica up switch substantially similar to the up switch of the first circuit, the second circuit having a replica down switch substantially similar to the down switch of the first circuit, the replica up switch coupled to the replica down switch at a first node of the second circuit, the second circuit having a replica current control circuit substantially similar to the current control circuit of the first circuit, the replica current control circuit having a bias input, the bias input of the second circuit connected to the bias input of the first circuit, the comparison circuit connected to the voltage control output and the bias input of the first circuit and to the first node and the bias input of the second circuit, the comparison circuit configured to compare the voltage control output of the first circuit and the first node of the second circuit, the comparison circuit configured to bias the bias input of the first circuit and the bias input of the second circuit in response to comparing the voltage control output of the first circuit and the first node of the second circuit, wherein there is no current conduction path between the first node and the voltage control output.

4. The circuit of claim 3 wherein the first circuit further includes an upbar switch configured to receive an upbar signal input, a downbar switch configured to receive a downbar signal input, the downbar switch coupled in series with the upbar switch; and the upbar switch and the downbar switch coupled in parallel with the up switch and down switch such that the up current source is coupled in series with the upbar switch opposite the downbar switch and the down current source is coupled in series with the downbar switch opposite the upbar switch.

5. The circuit of claim 4 wherein the first circuit further includes a dummy node disposed between the upbar switch and the downbar switch; and an operational amplifier having an input and an output, the input coupled to the voltage control output, the output coupled to the dummy node.

6. The circuit of claim 5 wherein the third circuit includes an operational amplifier having a first input, a second input, and an output, the first input coupled to the voltage control output of the first circuit, the second input coupled to the first node of the second circuit, the output coupled to the bias input of the first circuit and the bias input of the second circuit.

* * * * *